United States Patent [19]

Kimura

[11] Patent Number: 5,315,261
[45] Date of Patent: May 24, 1994

[54] COMPRESSING AND EXPANDING OPERATIONAL CIRCUIT WITH NO USE OF CLOCK SIGNAL

[75] Inventor: Katsuji Kimura, Tokyo, Japan

[73] Assignee: NEC Corporation, Tokyo, Japan

[21] Appl. No.: 7,791

[22] Filed: Jan. 22, 1993

[30] Foreign Application Priority Data

Jan. 22, 1992 [JP] Japan .................. 4-031523

[51] Int. Cl.[5] .................. H03L 5/00; H03K 5/01
[52] U.S. Cl. .................. 328/168; 328/169; 328/171; 328/31; 328/32; 307/494; 307/497; 307/529; 307/264
[58] Field of Search .............. 307/494, 497, 496, 264, 307/236, 262, 529; 328/118, 140, 141, 158, 160, 26, 31, 32, 168, 169, 171

[56] References Cited

U.S. PATENT DOCUMENTS

| | | | |
|---|---|---|---|
| 4,465,978 | 8/1984 | Helmstetter | 328/168 |
| 4,812,771 | 3/1989 | Lauper et al. | 328/168 |
| 4,920,279 | 4/1990 | Charlet et al. | 328/168 |

FOREIGN PATENT DOCUMENTS 2-138609  5/1990  Japan .

OTHER PUBLICATIONS

A Sigma-Delta Based Square-Law Compandor, IEEE 1990 Custom Integrated Circuits Conference, by K. Takasuka, et al., pp. 12.7.1–12.7.4.

Primary Examiner—Timothy P. Callahan
Attorney, Agent, or Firm—Burns, Doane, Swecker & Mathis

[57] ABSTRACT

An operational circuit without using a clock signal to be used for a compressing or expanding circuit, which comprises a first and second DC signals different in polarity from each other are obtained in response to an input AC signal. The AC signal and a first DC signal are differentially amplified to obtain a first differential output signal, and the AC signal and a second DC signal are differentially amplified to obtain a second differential output signal. A rectified AC signal thus obtained is averaged to obtain an averaged rectified signal as well as to obtain a first and second signals in accordance with the averaged rectified signal. The AC signal and the first signal are differentially amplified to obtain a third differential output signal and the AC signal and the second signal are differentially amplified to obtain a fourth differential output signal. The third and fourth differential output signals are combined so as to be opposite in polarity to take out the product signal of the AC signal and the averaged rectified signal.

5 Claims, 1 Drawing Sheet

FIG. 1

COMPRESSING AND EXPANDING OPERATIONAL CIRCUIT WITH NO USE OF CLOCK SIGNAL

BACKGROUND OF THE INVENTION

1. Field of the Invention

This invention relates to an operational circuit to be used for compressing or expanding an amplitude of an alternating current signal with no use of a clock signal.

2. Description of the Prior Art

As a compressing circuit and expanding circuit realizable with MOS type integrated circuit, such a circuit that is provided with an analog operational circuit using a $\Delta\Sigma$ modulation circuit and a rectifying and averaging circuit has been proposed previously, an example of which is disclosed in the Japanese Laid-Open Patent Publication No. 2-138609. The circuit thus disclosed has an analog operational circuit which comprises a $\Delta\Sigma$ modulation circuit composed of an A/D converter circuit and a first D/A converter circuit, a second D/A converter circuit and a low-pass filter.

An analog signal to be processed is converted through the A/D converter circuit of the $\Delta\Sigma$ modulation circuit into a digital signal in response to a clock signal and sent to the first D/A converter circuit. The digital signal is converted through the first D/A converter circuit into a first analog signal which takes a positive or negative value in response to a first reference signal and fed back to the A/D converter circuit as a differential input.

The digital signal outputted from the A/D converter circuit is also sent to the second D/A converter circuit to be converted into a second analog signal which takes a positive or negative value in response to a second reference signal and sent to the low-pass filter.

If at least one of the first and second reference signals is made an operational signal, an analog signal is outputted from the low-pass filter as the result of operation.

The first and second D/A converter circuits and the low-pass filter are made, for example, of a switched capacitor and an operational amplifier.

Such an expanding circuit that comprises the conventional operational circuit as explained above and a rectifying and averaging circuit is disclosed in FIG. 7 of the above-mentioned patent publication. The rectifying and averaging circuit comprises a rectifying circuit and an averaging circuit. As the rectifying circuit, for example, a full-wave or half-wave rectifier using a diode can be employed. The averaging circuit can be made, for example, of an operational amplifier having a feedback capacitor and a resistor. Besides, the rectifying and averaging circuit may be composed, for example, of a switched capacitor, a comparator and an operational amplifier.

With the conventional expanding circuit as explained above, an alternating current (AC) signal $V_{IN}$ to be processed is delivered to the $\Delta\Sigma$ modulation circuit of the analog operational circuit and the rectifying and averaging circuit. Here, if a signal obtained by rectifying the signal $V_{IN}$ is expressed as $|V_{IN}|$, and a signal obtained by averaging the same is expressed as $[|V_{IN}|]$, the signal $[|V_{IN}|]$ thus obtained by rectifying and averaging the signal $V_{IN}$ is sent to the second D/A converter circuit as the second reference signal. The analog operational circuit computes the product of the signals $|V_{IN}|$ and $[|V_{In}|]$, or $K_1 \cdot V_{IN} \cdot [|V_{IN}|]$ ($K_1$ is a constant) to output as an analog signal $V_{OUT}$ through the low-pass filter.

Namely, if $$V_{IN} = X \cdot \sin \omega t$$

where X is an amplitude, $\omega$ is an angular velocity and t is a time, the input signal $[|V_{IN}|]$ can be expressed as follows; $.OJOFF[|V_{IN}|] = K_2 \cdot X$ where $K_2$ is a constant. Hence $$V_{OUT} = K_1 \cdot V_{IN} \cdot [|V_{IN}|] = K_1 \cdot K_2 \cdot X^2 \cdot \sin \omega t$$

This means that an AC signal whose amplitude is expanded to $(K_1 \cdot K_2 \cdot X^2)$ can be obtained.

Such a compressing circuit that comprises the conventional operational circuit and a rectifying and averaging circuit is disclosed in FIG. 8 of the above-mentioned patent publication. The rectifying and averaging circuit used in this compressing circuit is the same as that of the expanding circuit already shown above.

With this conventional compressing circuit, the AC signal $V_{IN}$ to be processed is inputted to the $\Delta\Sigma$ modulation circuit of the analog operational circuit and sent through the low-pass filter to the rectifying and averaging circuit as the analog signal $V_{OUT}$. Here, if a signal obtained by rectifying the signal $V_{OUT}$ is expressed as $|V_{OUT}|$ and a signal obtained by averaging the signal $|V_{OUT}|$ is expressed as $[|V_{OUT}|]$, the signal $[|V_{OUT}|]$ as the output signal of the rectifying and averaging circuit is sent to the first D/A converter circuit as the first reference signal. The analog operational circuit computes the quotient of the signals $V_{IN}$ and $[|V_{OUT}|]$, or $K_3 \cdot V_{IN}/[|V_{OUT}|]$ ($K_3$ is a constant) to output from the low-pass filter as the analog signal $V_{OUT}$.

Namely, if $$V_{IN} = X \cdot \sin \omega t$$

$$V_{OUT} = Y \cdot \sin \omega t$$

where Y is an amplitude, the output signal $[|V_{OUT}|]$ can be expressed as follows;

$$[|V_{OUT}|] = K_4 \cdot Y$$

$$V_{OUT} = (K_3 \cdot V_{IN})/[|V_{OUT}|] = (K_3 \cdot V_{IN})/(K_4 \cdot Y)$$

where $K_4$ is a constant. Hence $$Y = (K_3/K_4)^{\frac{1}{2}} \cdot X^{\frac{1}{2}}$$

Therefore $$V_{OUT} = (K_3/K_4)^{\frac{1}{2}} \cdot X^{\frac{1}{2}} \cdot \sin \omega t$$

This means that an AC signal whose amplitude is compressed to $\{(K_3/K_4)^{\frac{1}{2}} \cdot X^{\frac{1}{2}}\}$ can be obtained.

With the conventional expanding and compressing ucircuits shown above, however, a clock signal is employed and as a result, there is such a problem that it is difficult to obtain a compressed signal or expanded signal having a good signal-to-noise ratio due to the effects of a clock noise.

In addition, the $\Delta\Sigma$ modulation circuit or switched capacitor type rectifying and averaging circuit becomes large in circuit scale and as a result, there arises such a problem that semiconductor integrated circuits to be used are unavoidably large in chip size as well as increased in power consumption.

SUMMARY OF THE INVENTION

An object of this invention is to provide an operational circuit to be used for a compressing or expanding circuit which does not use a clock signal.

Another object of this invention is to provide an operational circuit to be used for a compressing or expanding circuit which can be realized with semiconductor integrated circuits small in chip size and reduced in power consumption.

An operational circuit of this invention comprises a polarity judging circuit, a first differential amplifier circuit and a second differential amplifier circuit which are equal in circuit structure to each other, an averaging circuit, and a third differential amplifier circuit and a fourth differential amplifier circuit which are equal in circuit structure to each other.

The polarity judging circuit judges a polarity of an AC signal voltage to be applied thereby to generate and output a first direct current (DC) signal and a second DC signal whose voltage difference is predetermined and different in polarity from each other depending on the judgment of being positive and negative.

The first differential amplifier circuit receives the input AC signal and the first DC signal to differentially amplify thereby to output a first differential output signal.

The second differential amplifier circuit receives the input AC signal and the second DC signal to differentially amplify thereby to output a second differential output signal.

The averaging circuit obtains a rectified signal in response to the first and second differential output signals and averages the rectified signal thus obtained thereby to generate an averaged rectified signal. In addition, the averaging circuit generates and outputs a first signal and a second signal in response to the averaged rectified signal, the difference of which is dependent only on the averaged rectified signal and the sum of which is independent of the averaged rectified signal.

The third differential amplifier circuit receives the input AC signal and the first signal to differentially amplify thereby to output a third differential output signal.

The fourth differential amplifier circuit receives the input AC signal and the second signal to differentially amplify thereby to output a fourth differential output signal.

A differential output terminals pair is applied with the third and fourth differential output signals so as to be combined opposite in polarity thereby to output the product signal of the input AC signal and the averaged rectified signal as an output signal of the operational circuit.

The polarity judging circuit is not limited specifically on its circuit structure, if it has the above-described functions. The absolute values of the DC voltages of the first and second DC signals may be equal to or different from each other.

The first and second differential amplifier circuits each may be structured arbitrarily if it has the above-described functions, but, it is preferable to be composed of two pairs of transistors, each of which are made of two transistors different in capacity value from each other and are driven by the corresponding one of constant currents, to form squaring circuits.

Here, the "capacity value" of a transistor means the gate width(W)-to-gate length(L) ratio (W/L) for an MOS transistor and the emitter area for a bipolar transistor.

The third and fourth differential amplifier circuits are preferable to be equal in circuit structure to the first and second amplifier circuits, but may be different in circuit structure therefrom.

The averaging circuit may be arbitrarily structured if it makes possible to average a rectified signal obtained in response to the first and second differential output signals. However, the averaging circuit is preferable to comprise two current mirror circuits and an averaging capacitor.

With the operational circuit of this invention, the input AC signal is delivered to the polarity judging circuit and the first to fourth differential amplifier circuits. The polarity judging circuit judges the polarity, positive or negative, of the AC signal voltage to generate and output the first and second DC signals in accordance with the judgment. The first DC is inputted simultaneously with the AC signal to the first differential amplifier circuit to be differentially amplified, thus the first differential output signal being outputted. Similarly, the second DC signal is inputted simultaneously with the AC signal to the second differential amplifier circuit to be differentially amplified, thus the second differential output signal being outputted. The first and second differential output signals are sent to the averaging circuit so as to be combined opposite in polarity to each other, thus a full-wave rectified signal of the input AC signal being obtained.

For example, in the case that the voltage difference between the first and second DC signals is "$+\Delta E$" (or "$-\Delta E$") when a voltage $V_{IN}$ of the AC signal is positive and "$-\Delta E$" (or "$+\Delta E$") when it is negative, these first and second DC signals are differentially amplified individually with the AC signal to generate the first and second differential output signals and these first and second differential output signals are combined so as to be opposite in polarity to each other, the differential output current $\Delta I_{REC}$ after combination becomes as follows;

$$\Delta I_{REC} = K_5 \cdot (\pm \Delta E) \cdot V_{IN} = K_5 \cdot \Delta E \cdot |V_{IN}|$$

where $K_5$ is a constant. This means that the full-wave rectified signal of the input AC signal voltage $V_{IN}$ can be obtained.

The full-wave rectified signal is averaged through the averaging circuit and as a result, the averaged rectified signal $[|V_{IN}|]$ which is proportional to the amplitude of the AC signal voltage $V_{IN}$ is generated.

For example, if $$V_{IN} = X \cdot \sin \omega t,$$

the averaged rectified signal $[|V_{IN}|]$ becomes as $$[|V_{IN}|] = K_6 \cdot X$$

where $K_6$ is a constant.

The averaging circuit outputs the first and second signals containing the averaged rectified signal thus obtained. These first and second signals are related so that the difference therebetween is dependent only on the averaged rectified signal and the sum thereof is independent of the averaged rectified signal. As a result, for example, if the first and second signal voltages are respectively expressed as $V_1$ and $V_2$, and $K_7$ and $K_8$ are constants, the following equations can be obtained as;

$$V_1 - V_2 = K_7 \cdot [|V_{IN}|]$$

$$V_1 + V_2 = K_8$$

The third differential amplifier circuit differentially amplifies the AC signal and the first signal to generate and output the third differential output signal. The fourth differential amplifier circuit differentially amplifies the AC signal and the second signal to generate and output the fourth differential output signal. The third and fourth differential output signals are combined so as to be opposite in polarity to each other, thus the product signal of the AC signal and the averaged rectified signal is outputted from the differential output terminals pair.

For example, the differential output current $\Delta I_3$ of the third differential output signal obtained by differentially amplifying the AC signal $V_{IN}$ and the first signal $V_1$ can be expressed as follows;

$$\Delta I_3 = K_9 - K_{10} \cdot (V_{IN} - V_1)^2$$

where $K_9$ and $K_{10}$ are constants.

Similarly, the differential output current $\Delta I_4$ of the fourth differential output signal obtained by differentially amplifying the AC signal $V_{IN}$ and the second signal $V_2$ can be expressed as follows:

$$\Delta I_4 = K_9 - K_{10} \cdot (V_{IN} - V_2)^2$$

The third and fourth differential output signals are combined so as to be opposite in polarity to each other, so that the differential output current $I_{OUT}$ outputted from the differential output terminals pair becomes as follows;

$$\Delta I_{OUT} = \Delta I_3 - \Delta I_4$$
$$= K_{10} \cdot (V_1 - V_2) \cdot \{2V_{IN} - (V_1 + V_2)\}$$

Here, ·ojoff $V_1 - V_2 = K_7 \cdot [|\Delta V_{IN}|]$ $$V_1 + V_2 = K_8$$

Therefore $$\Delta I_{OUT} = 2 \cdot K_7 \cdot K_{10} \cdot [|V_{IN}|] \cdot V_{IN} - K_7 \cdot K_8 \cdot K_{10} \cdot [|V_{IN}|]$$

Here, if the DC bias voltage value $K_7 \cdot K_8 \cdot K_{10} \cdot [|V_{IN}|]$ is concealed, the following can be obtained as:

$$\Delta I_{OUT} = 2 \cdot K_7 \cdot K_{10} \cdot [|V_{IN}|] \cdot V_{IN}$$

Thus, the differential output current $\Delta I_{OUT}$ as the product of the AC signal $V_{IN}$ and the averaged rectified signal thereof $[|V_{IN}|]$ can be obtained.

In the case of using the operational circuit of this invention to form an expanding circuit, for example, a load resistor is provided between the differential output terminals pair to convert the current $\Delta I_{OUT}$ into a voltage.

If the load resistance and the output voltage are expressed as $R_L$ and $V_{OUT}$, respectively, the following can be obtained as;

$$V_{OUT} = R_L \cdot \Delta I_{OUT} = R_L \cdot 2 \cdot K_7 \cdot K_{10} \cdot [|V_{IN}|] \cdot V_{IN}$$
$$= 2 \cdot K_6 \cdot K_7 \cdot K_{10} \cdot B_L \cdot X^2 \cdot \sin \omega t$$

Thus, such an AC signal voltage whose amplitude is expanded to $(2 \cdot K_6 \cdot K_7 \cdot K_{10} \cdot R_L \cdot X^2)$ can be obtained.

In the case of using the operational circuit of this invention as a compressing circuit, for example, an operational amplifier is used in combination with the operational circuit and the output signal $V_{OUT}$ of the operational amplifier is inputted into the operational circuit, and the input AC signal $V_{IN}$ and the output signal of the operational circuit are differentially amplified through the operational amplifier.

If the gain of the operational amplifier is expressed as G, the following can be obtained as;

$$G \cdot (V_{IN} - K_{11} \cdot [|V_{OUT}|] \cdot V_{OUT}) = V_{OUT}$$

Here $(1/G)$ is nearly equal to 0. Therefore $$V_{IN} = K_{11} \cdot [|V_{OUT}|] \cdot V_{OUT}$$

If $$V_{IN} = X \cdot \sin \omega t$$

$$V_{OUT} = Y \cdot \sin \omega t,$$

then, $$[|V_{OUT}|] = K_6 \cdot Y$$

Therefore $$Y = \{1/(K_6 \cdot K_{11})\}^{\frac{1}{2}} \cdot X^{\frac{1}{2}}$$

Hence $$V_{OUT} = \{1/(K_6 \cdot K_{11})\}^{\frac{1}{2}} \cdot X^{\frac{1}{2}} \cdot \sin \omega t$$

This means that the amplitude of the AC signal $V_{IN}$ is compressed to $\{(1/K_6 \cdot K_{11})^{\frac{1}{2}} \cdot X^{\frac{1}{2}}\}$.

DESCRIPTION OF THE PREFERRED EMBODIMENT

Preferred embodiment of this invention will be described below while referring to the drawing.

Figure 1:
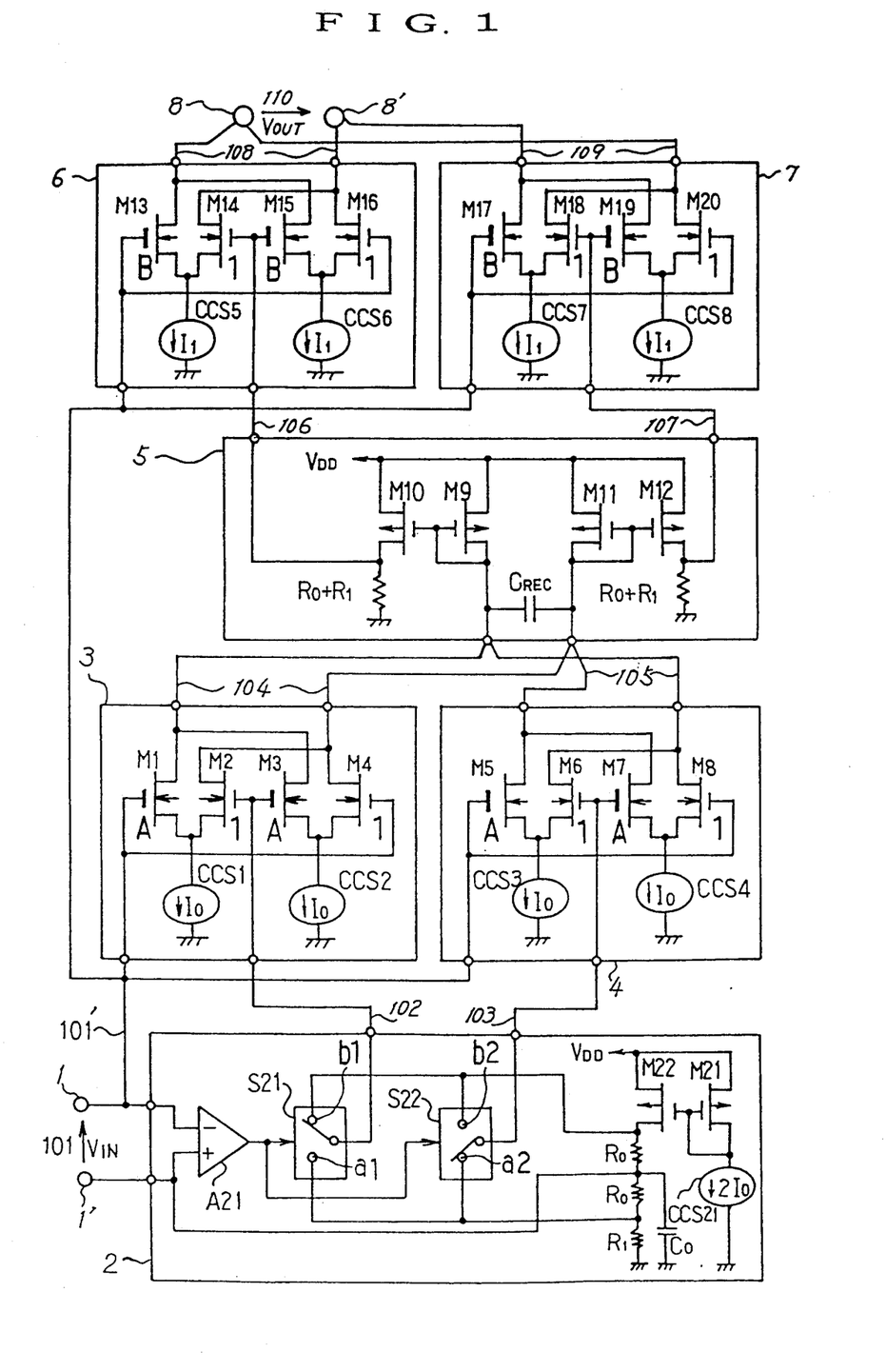
FIG. 1 is a circuit diagram of an operational circuit to be used for a compressing or expanding circuit according to an embodiment of this invention.

FIG. 1 shows an operational circuit according to an embodiment of this invention, which is realized with CMOS integrated circuits. This circuit comprises a polarity judging circuit 2, a first differential amplifier circuit 3, a second differential amplifier circuit 4, an averaging circuit 5, a third differential amplifier circuit 6, and a fourth differential amplifier circuit 7. Terminals 1 and 1' constitute an input terminals pair to be applied with an AC signal 101 having a voltage $V_{IN}$, and terminals 8 and 8' constitute a differential output terminals pair for outputting a product signal 110 (voltage $V_{OUT}$) of the AC signal 101 and its averaged rectified signal.

Polarity judging circuit

The polarity judging circuit 2 comprises a comparator A21, selecting switches S21 and S22, p-channel MOS transistors M21 and M22, a constant current source CCS21 for generating a constant current $2I_0$, resistors $R_0$ and $R_1$, and a capacitor $C_0$. This circuit 2 judges the polarity of the voltage $V_{IN}$ inputted and generates a first DC signal 102 and a second DC signal 103 in response to the judgment result thereby to send them respectively to the first differential amplifier circuit 3 and second differential amplifier circuit 4.

The MOS transistors M21 and M22 form a first current mirror circuit, and the drain current of the transistor M22 becomes the constant current $2I_0$. As a result, the positive (+) side terminal of the comparator A21 is applied with the following DC bias voltage $E_0$ as;

$$E_0 = 2(R_0 + R_1) \cdot I_0$$

Besides, respective terminals b1 and b2 of the selecting switches S21 and S22 are applied with the following DC voltage $E_1$ as;

$$E_1 = 2 \cdot (2 \cdot R_0 + R_1) \cdot I_0 = E_0 + 2 \cdot R_0 \cdot I_0 = E_0 + \Delta E/2$$

The respective terminals a1 and a2 of the switches S21 and S22 are applied with the following DC voltage $E_2$ as;

$$E_2 = 2 \cdot R_1 \cdot I_0 = E_0 - 2 \cdot R_0 \cdot I_0 = E_0 - \Delta E/2$$

where, $\Delta E/2 = 2 \cdot R_0 \cdot I_0$

The voltage $V_{IN}$ of the AC signal 101 applied to the input terminals pair (1 and 1') is inputted to the comparator A21 through its positive (+) side input terminal and negative (−) side input terminal. The output signal of the comparator A21 becomes a low logical level (logical level "0") when $V_{IN} \geq E_0$, and becomes a high logical level (logical level "1") when $V_{IN} < E_0$, thereby controlling the selecting switches S21 and S22.

The selecting switch S21 selects the DC voltage $E_1$ when the output of the comparator A21 is at the logical level "0", and selects the DC voltage $E_2$ when it is at the logical level "1". After selection, the switch S21 outputs the first DC signal 102. On the other hand, the selecting switch S22 selects the DC voltage $E_2$ when the output signal of the comparator A21 is at the logical level "0", and selects the DC voltage $E_1$ when it is at the logical level "1". After selection, the switch S22 outputs the second DC signal 103.

That is, the comparator A21 judges the polarity of the voltage $V_{IN}$ of the AC signal 101, and when judged to be positive, the first DC signal 102 becomes an AC signal having the voltage $E_1$ and the second DC signal 103 becomes a DC signal having the voltage $E_2$. When judged to be negative, the first DC signal 102 becomes a DC signal having the voltage $E_2$ and the second DC signal 103 becomes a DC signal having the voltage $E_1$.

Referring to the voltage difference of the first and second DC signals 102 and 103, when judged to be positive it becomes as $$E_1 - E_2 = (E_0 + \Delta E/2) - (E_0 - \Delta E/2) = +\Delta E$$

when judged to be negative, it becomes as $$E_2 - E_1 = (E_0 - \Delta E/2) - (E_0 + \Delta E/2) = -\Delta E$$

This means that the voltage difference is equal in absolute value but opposite in polarity when judged to be positive and negative.

An AC signal 101' on the side of the input terminal 1 and the second DC signal 102 are inputted to the first differential amplifier circuit 3, and the AC signal 101' and the second DC signal 103 are inputted to the second differential amplifier circuit 4. The AC signal 101' has a voltage $V_{IN'}$ as $$V_{IN'} = V_{IN} + E_0 = V_{IN} + 2(E_0 + R_1) \cdot I_0$$

First differential amplifier circuit

The first differential amplifier circuit 3 performs the differential amplification of the AC signal 101' on the side of the input terminal 1 and the first DC signal 102 thereby to generate and output a first differential output signal 104. Then, n-channel MOS transistors M1 and M2 form a first differential pair and n-channel MOS transistors M3 and M4 form a second differential pair, which are driven by respective constant current sources CCS1 and CCS2 for generating a constant current $I_0$.

The capacity value, that is, gate width(W)-to-gate length(L) ratio, of the transistor M1 is A times (A > 1) as large as that of the transistor M2. Similarly, the transistor M3 has a capacity value A times as large as that of the transistor M4. As a result, the first and second differential pairs each forms a squaring circuit.

The gate of the transistor M1 having a large capacity of the first differential pair and the gate of the transistor M4 having a small capacity of the second differential pair are connected in common to be applied with the AC signal 101'. The gate of the transistor M2 having a small capacity of the first differential pair and the gate of the transistor M2 having a large capacity of the second differential pair are connected in common to be applied with the first DC signal 102.

The sources of the transistors M1 and M2 of the first differential pair are connected in common to the constant current source CCS1, and the sources of the transistors M3 and M4 of the second differential pair are connected in common to the constant current source CCS2.

The drains of the transistors M1 and M3 large in capacity of respective first and second differential pairs are connected in common, and the drains of the transistors M2 and M4 small in capacity of respective differential pairs are connected in common, thus outputting the first differential output signal 104 to the averaging circuit 5 respectively therethrough.

Second differential amplifier circuit

The second differential amplifier circuit 4 differentially amplifies the AC signal 101' and the second DC signal 103 thereby to generate and output a second differential output signal 105. The circuit 4 is equal in circuit structure to the first differential amplifier circuit 3. Namely, n-channel MOS transistors M5 and M6 form a third differential pair and n-channel MOS transistors M7 and M8 form a fourth differential pair, which are driven by respective constant current sources CCS3 and CCS4 for generating a constant current $I_0$.

The transistor M5 has a capacity value, that is, gate width(W)-to-gate length(L) ratio (W/L), which is A times (A > 1) as large as that of the transistor M6. Similarly, the transistor M7 has a capacity A times as large as that of the transistor M8. This means that each of the third and fourth differential pairs forms a squaring circuit.

The gate of the transistor M5 large in capacity of the third differential pair and the gate of the transistor M8 small in capacity of the fourth differential pair are connected in common to be applied with the AC signal 101'. The gate of the transistor M6 small in capacity of the third differential pair and the gate of the transistor M7 large in capacity of the fourth differential pair are connected in common to be applied with the second DC signal 103.

The sources of the transistors M5 and M6 of the third differential pair are connected in common to the constant current source CCS3, and the sources of the transistors M7 and M8 of the fourth differential pair are connected in common to the constant current source CCS4.

The drains of the transistors M5 and M7 large in capacity of respective third and fourth differential pairs are connected in common, and the drains of the transistors M6 and M8 small in capacity of respective differential pairs are connected in common, thereby outputting the second differential output signal 105 to the averaging circuit 5 respectively therethrough.

Averaging circuit

The averaging circuit 5 combines the first differential output signal 104 and second differential output signal 105 so as to be opposite in polarity to each other, thus being capable of obtaining a full-wave rectified signal of the AC signal 101. The averaging circuit 5 averages the full-wave rectified signal thus obtained thereby to generate and output a first signal 106 and a second signal 107 respectively to the third differential amplifier circuit 6 and fourth differential amplifier 7.

In the averaging circuit 5, p-channel MOS transistors M9 and M10 form a second current mirror circuit and p-channel MOS transistors M11 and M12 form a third current mirror circuit. The first differential output signal 104 is combined and inputted through the drain to the transistor M9 and the second differential output signal 105 is combined and inputted through the drain to the transistor M11. The full-wave rectified signal of the AC signal 101 is averaged through a capacitor $C_{REC}$ inserted between the drains of the transistors M9 and M11.

In addition, resistors $(R_0+R_1)$ are respectively provided between the ground and the drain of the transistor 10 and between the ground and the drain of the transistor 12. By these resistors $(R_0+R_1)$, the first and second signals 106 and 107 are respectively generated in response to the full-wave rectified signal thus averaged.

Third differential amplifier circuit

The third differential amplifier circuit 6 differentially amplifies the AC signal 101' and the first signal 106 thereby to generate a third differential output signal 108 which is sent to the output terminals 8 and 8'. The circuit 6 is equal in circuit structure to that of each of the first and second differential amplifiers 3 and 4. Namely, n-channel MOS transistors M13 and M14 form a fifth differential pair, and n-channel MOS transistors M15 and M16 form a sixth differential pair, which are driven by respective constant current sources CCS5 and CCS6 for generating a constant current $I_1$.

The transistor M13 has a capacity value B times (B>1) as large as that of the transistor M14 and similarly, the transistor M15 has a capacity value B times as large as that of the transistor M16, thus each of the fifth and sixth differential pairs forms a squaring circuit as well.

The gate of the transistor M13 large in capacity of the fifth differential pair and the gate of the transistor M16 small in capacity of the sixth differential pair are connected in common to be applied with the AC signal 101'. The gate of the transistor M14 small in capacity of the fifth differential pair and the gate of the transistors M15 large in capacity of the sixth differential pair are connected in common to be applied with the first signal 106.

The sources of the transistors M13 and M14 of the fifth differential pair are connected in common to the constant current source CCS5, and the sources of the transistors M15 and M16 of the sixth differential pair are connected in common to the constant current source CCS6.

The drains of the transistors M13 and M15 large in capacity of respective fifth and sixth differential pairs are connected in common, and the drains of the transistors M14 and M16 small in capacity of respective differential pairs are connected in common, thereby outputting the third differential output signal 108 to the output terminals 8 and 8' respectively therethrough.

Fourth differential amplifier circuit

The fourth differential amplifier circuit 7 differentially amplifies the AC signal 101' and the second signal 107 thereby to generate a fourth differential output signal 109 which is sent to the output terminals 8 and 8'. The circuit 7 is equal in circuit structure to the third differential amplifier circuit 6. Namely, n-channel MOS transistors M17 and M18 form a seventh differential pair, and n-channel MOS transistors M19 and M20 form an eighth differential pair, which are driven by respective constant current sources CCS7 and CCS8 for generating a constant current $I_1$.

The transistor M17 has a capacity value B times as large as that of the transistor M18, and the transistor M19 has a capacity value B times as large as that of the transistor M20, which means that each of the seventh and eighth differential pairs forms a squaring circuit as well.

The gate of the transistor M17 large in capacity of the seventh differential pair and the gate of the transistor M20 small in capacity of the eighth differential pair are connected in common to be applied with the AC signal 101', and the gate of the transistor M18 small in capacity of the seventh differential pair and the gate of the transistor M19 large in capacity of the eighth differential pair are connected in common to be applied with the second signal 107.

The sources of the transistors M17 and M18 of the seventh differential pair are connected in common to the constant current source CCS7, and the sources of the transistors M19 and M20 of the eighth differential pair are connected in common to the constant current source CCS8.

The drains of the transistors M17 and M19 large in capacity of respective seventh and eighth differential pairs are connected in common, and the drains of the transistors M18 and M20 small in capacity of respective differential pairs are connected in common, thereby outputting the fourth differential output signal 109 to the output terminals 8 and 8' respectively therethrough.

In this case, the third differential output signal 108 and the fourth differential output signal 109 are sent to the output terminals 8 and 8' so as to be combined opposite in polarity to each other, thus being capable of taking out the differential output signal 110 from the output terminals 8 and 8'.

In FIG. 1, $V_{DD}$ is a DC power source voltage.

Operational principle

The operational principle of the circuit shown in FIG. 1 will be explained below.

First, the first differential amplifier circuit 3 operates differential amplification as follows;

Referring to the transistors M1 to M4, if the mobility is expressed as $\mu_n$, the gate oxide film capacitance per unit area is expressed as $C_{ox}$, the threshold voltage is expressed as $V_T$, and the gate-to-source voltages of the transistors M1 and M2 are respectively expressed as $V_{GS1}$ and $V_{GS2}$, due to the fact that the capacity of the transistor M1 is A times as large as that of the transistor M2 and the capacity of the transistor M3 is also A times as large as that of the transistor M4, the drain currents $I_{d1}$ and $I_{d2}$ of the transistors M1 and M2 can be respectively expressed as follows;

$$I_{d1} = A \cdot \beta_1 \cdot (V_{GS1} - V_T)^2 \quad (1)$$

$$I_{d2} = \beta_1 \cdot (V_{GS2} - V_T)^2 \quad (2)$$

where $\beta_1$ is defined as $$\beta_1 = \mu_n (C_{ox}/2)(W/L)_1 \quad (3)$$

The first differential pair formed of the transistors M1 and M2 is driven by the constant current $I_O$. As a result, the following equation can be established as;

$$I_{d1} + I_{d2} = I_O \quad (4)$$

In addition, if the inter-gate voltage of the transistors M1 and M2 is expressed as $V_A$, the following equation can be obtained as;

$$V_{GS1} - V_{GS2} = V_A \quad (5)$$

From equations (1), (2), (4) and (5), the differential output current $\Delta I_{1-2}$ of the first differential pair can be obtained as follows;

$$\begin{aligned}
\Delta I_{1-2} &= I_{d1} - I_{d2} = I_0 - 2 I_{d2} \quad (6)\\
&= I_0 - 2[-A \cdot \beta_1 \cdot V_A + \{A^2 \cdot \beta_1 \cdot V_A^2 - \\
&\quad (A + 1)(A \cdot \beta_1 \cdot V_A^2 - I_0)\}^{\frac{1}{2}}]^2/(A + 1)^2 \\
&= [(A - 1)\{(A + 1) \cdot I_0 - 2 \cdot A \cdot \beta_1 \cdot V_A^2\}]/(A + 1)^2 + \\
&\quad [4 \cdot A \cdot V_A \{(A + 1) \cdot \beta_1 \cdot I_0 - A \cdot \beta_1^2 \cdot V_A^2\}^{\frac{1}{2}}]/(A + 1)^2
\end{aligned}$$

Similarly, if the gate-to-source voltages of the transistors M3 and M4 are respectively expressed as $V_{GS3}$ and $V_{GS4}$, the following equation can be established as $$V_{GS3} - V_{GS4} = -V_A \quad (5')$$

Therefore, the differential output current $\Delta I_{3-4}$ of the second differential pair formed of the transistors M3 and M4 can be obtained as follows;

$$\begin{aligned}
\Delta I_{3-4} &= I_{d3} - I_{d4} \quad (7)\\
&= [(A - 1)\{(A + 1) \cdot I_0 - 2 \cdot A \cdot \beta_1 \cdot V_A^2\}]/(A + 1)^2 - \\
&\quad [4 \cdot A \cdot V_A \{(A + 1) \cdot \beta_1 \cdot I_0 - A \cdot \beta_1^2 \cdot V_A^2\}^{\frac{1}{2}}]/(A + 1)^2
\end{aligned}$$

As already explained above, the differential output currents of the first and second differential pairs are combined with each other to generate the first differential output signal 104. As a result, the drain currents $I_{d1}$ and $I_{d3}$ are combined with each other and the drain currents $I_{d2}$ and $I_{d4}$ are combined with each other, so that the differential output current $\Delta I_A$ as the first differential output signal 104 can be obtained as follows;

$$\begin{aligned}
I_A &= (I_{d1} + I_{d3}) - (I_{d2} + I_{d4}) \quad (8)\\
&= (I_{d1} - I_{d2}) + (I_{d3} - I_{d4}) \\
&= I_{1-2} + I_{3-4} \\
&= \{2(A - 1)/(A + 1)\} \cdot I_o - \\
&\quad \{4A(A - 1)\beta_1/(A + 1)^2\} \cdot V_A^2
\end{aligned}$$

From equation (8), it can be found that the differential output current $\Delta I_A$ as the first differential output signal 104 is composed of the current component depending on the constant current $I_O$ and the current component depending on the square of the inter-gate voltage $V_A$, or $V_A^2$.

The second differential amplifier circuit 4 operates the differential amplification of the AC signal 101' and the second DC signal 103 to generate the second differential output signal 105. The circuit 4 is equal in circuit structure to the first differential amplifier circuit 3. In addition, the transistors M5 and M6 of the third differential pair and the transistors M7 and M8 of the fourth differential pair are equal in characteristics to the transistors M1 and M2 of the first differential pair and the transistors M3 and M4 of the second differential pair.

Accordingly, if the gate-to-source voltages of the transistors M5, M6, M7 and M8 are respectively expressed as $V_{GS5}$, $V_{GS6}$, $V_{GS7}$ and $V_{GS8}$ and the intergate voltage of the transistors M5 and M6 is expressed as $V_B$, the following equation can be obtained as $$V_{GS5} - V_{GS6} = V_B \quad (5'')$$

$$V_{GS7} - V_{GS8} = -V_B \quad (5''')$$

As a result, the differential output current $I_B$ as the second differential output signal 105 can be obtained as follows;

$$I_B = \{2(A-1)/(A+1)\} \cdot I_0 - \{4A \cdot (A-1) \cdot \beta_1 / (A+1)^2\} \cdot V_B^2 \quad (9)$$

The first and second differential output signals 104 and 105 are sent to the averaging circuit 5 so as to be combined opposite in polarity to each other. As a result, the differential output current $\Delta I_{REC}$ after combination can be obtained as follows;

$$\begin{aligned}
\Delta I_{REC} &= \Delta I_A - \Delta I_B \quad (10)\\
&= \{4A \cdot (A - 1) \cdot \beta_1/(A + 1)\}^2 \cdot (V_B^2 - V_A^2)
\end{aligned}$$

Here, when the voltage $V_{IN}$ of the AC signal 101 is positive in polarity, that is, $V_{IN} \geq 0$, the voltage $E_1$ of the first DC signal 102, voltage $E_2$ of the second DC signal 103 and voltage $V_{IN}'$ of the AC signal 101' can be obtained as follows;

$$E_1 = E_0 + \Delta E/2$$

$E_2 = E_0 - \Delta E/2$ $V_{IN}' = V_{IN} + E_0$

Accordingly, the voltages $V_A$ and $V_B$ can be obtained as follows;

$$V_A = (V_{IN} + E_0) - (E_0 + \Delta E/2) \quad (11)$$
$$= V_{IN} - \Delta E/2$$
$$V_B = (V_{IN} + E_0) - (E_0 - \Delta E/2) \quad (12)$$
$$= V_{IN} + \Delta E/2$$

By substituting equations (11) and (12) into equation (10), the differential output current $\Delta I_{REC}$ can be expressed as follows;

$$\Delta I_{REC} = \{8A \cdot (A-1) \cdot \beta_1/(A+1)^2\} \cdot (+\Delta E) \cdot V_{IN} \quad (13)$$
$$= \{8A \cdot (A-1) \cdot \beta_1/(A+1)^2\} \cdot \Delta E \cdot |V_{IN}|$$

(where $V_{IN} \geq 0$)

When the voltage $V_{IN}$ of the AC signal 101 is negative in polarity, that is, $V_{IN} \leq 0$, the voltage $E_2$ of the first DC signal 102 and the voltage $E_1$ of the second DC signal 103 can be obtained as follows;

$E_2 = E_0 - \Delta E/2$ $E_1 = E_0 + \Delta E/2$

As a result, the voltages $V_A$ and $V_B$ can be obtained as follows;

$$V_A = (V_{IN} + E_0) - (E_0 - \Delta E/2) \quad (14)$$
$$= V_{IN} + \Delta E/2$$
$$V_B = (V_{IN} + E_0) - (E_0 + E/2) \quad (15)$$
$$= V_{IN} - \Delta E/2$$

By substituting equations (14) and (15) into equation (10), the differential output current $\Delta I_{REC}$ can be obtained as follows;

$$\Delta I_{REC} = \{8A \cdot (A-1) \cdot \beta_1/(A+1)^2\} \cdot (-\Delta E) \cdot V_{IN} \quad (16)$$
$$= \{8A \cdot (A-1) \cdot \beta_1/(A+1)^2\} \cdot \Delta E \cdot |V_{IN}|$$

(where $V_{IN} < 0$)

As seen from equations (13) and (16), the differential output current $I_{REC}$ is proportional to the absolute voltage value $|V_{IN}|$ of the AC signal 101 and as a result, it can be found that the combination of the first and second differential output signals 104 and 105 makes possible to obtain a full-wave rectified signal of the alternating current signal 101.

Next, the full-wave rectified signal is averaged through the capacitor $C_{REC}$ of the averaging circuit 5. If the differential output current after averaging is expressed as $[|\Delta I_{REC}|]$, it can be expressed as follows;

$$[|\Delta I_{REC}|] = (1/T) \int_0^T \Delta I_{REC} \, dt \quad (17)$$
$$= \{8A \cdot (A-1) \cdot \beta_1/(A+1)^2\} \cdot \Delta E \cdot [|V_{IN}|]$$
$$= \{32A \cdot (A-1) \cdot \beta_1/(A+1)^2\} \cdot R_0 \cdot I_0 \cdot [|V_{IN}|]$$

The p-channel MOS transistors M9 and M10 form a current mirror circuit and the p-channel MOS transistors M11 and M12 also form a current mirror circuit, respectively, so that respective drain currents $I_{d9}$, $I_{d10}$, $I_{d11}$ and $I_{d12}$ of the transistors M9, M10, M11 and M12 can be related as follows;

$I_{d9} = I_{d10}$ $I_{11} = I_{d12}$ and $I_{d9} + I_{d11} = 4 I_0$ $I_{d9} - I_{d11} = [|I_{REC}|]$ The drain currents $I_{d10}$ and $I_{d12}$ can be obtained as follows;

$$L_{d10} = 2I_0 + (\tfrac{1}{2})[|I_{REC}|] \quad (18)$$

$$L_{d12} = 2I_0 - (\tfrac{1}{2})[|I_{REC}|] \quad (19)$$

The averaging circuit 5 outputs the first signal 106 and the second signal 107. The voltage $V_1$ of the first signal 106 and the voltage $V_2$ of the second signal 107 can be expressed as follows;

$V_1 = (R_0 + R_1) I_{d10} = (R_0 + R_1)(2I_0 + [\Delta I_{REC}]/2)$ $V_2 = (R_0 + R_1) I_{d12} = (R_0 + R_1)(2I_0 - [\Delta I_{REC}]/2)$ This means that the first and second signals 106 and 107 each contains the term of the averaged rectified signal current $[I_{REC}]$, and the difference $(V_1 - V_2)$ of the voltages $V_1$ and $V_2$ becomes a signal $(R_0 + R_1)[\Delta I_{REC}]$ which is dependent only on the current $[\Delta I_{REC}]$ and the sum $(V_1 + V_2)$ thereof becomes a signal $\{4(R_0 + R_1) \cdot I_0\}$ which is independent of the current $[\Delta I_{REC}]$.

The AC signal 101' and the first averaged rectified signal 106 are inputted to the third differential amplifier circuit 6, and the AC signal 101' and the second averaged rectified signal 107 are inputted to the fourth differential amplifier circuit 7.

The third differential amplifier circuit 6 is equal in circuit structure to the first differential amplifier circuit 3, and the transistors M13, M14, M15 and M16 of the circuit 6 are corresponded respectively to the transistors M1, M2, M3 and M4 of the first differential amplifier circuit 3, and the constant current sources CCS5 and CCS6 thereof are corresponded respectively to the constant current sources CCS1 and CCS2 thereof. In addition, the fourth differential amplifier circuit 7 is also equal in circuit structure to the first differential amplifier circuit 3, and the transistors M17, M18, M19 and M20 of the circuit 7 are corresponded respectively to the transistors M1, M2, M3 and M4 of the circuit 3, and the constant current sources CCS7 and CCS8 thereof are corresponded respectively to the constant current sources CCS1 and CCS2.

Accordingly, the third differential amplifier circuit 6 operates the differential amplification of the AC signal 101' and the first signal 106 thereby to generate the third differential output signal 108 on the same operational principle as that of the first differential amplifier circuit 3. As a result, the differential output current $\Delta I_C$ of the third differential output signal 108 can be expressed as follows;

$$\Delta I_C = \{2(B-1)/(B+1)\} \cdot I_1 - [\{4B(B-1)\cdot\beta_2\}/(B+1)^2] \cdot V_C^2 \quad (20)$$

From equation (20), it can be found that the current $\Delta I_C$ is composed of the current component depending on the constant current $I_1$ and the current component depending on the square of the voltage $V_C$, or $V_C^2$.

Where, $V_C$ is the inter-gate voltage of the transistors M13 and M14 and $\beta_2$ is defined as $$\beta_2 = \mu n(C_{ox}/2)(W/L)_2 \quad (21)$$

The fourth differential amplifier circuit 7 performs the differential amplification of the AC signal 101' and the second signal 107 thereby to generate the fourth differential output signal 109. Similar to the case of the third differential amplifier circuit 6, the differential output current $\Delta I_D$ of the fourth differential output signal 109 can be obtained as follows;

$$\Delta I_D = \{2(B-1)/(B+1)\} \cdot I_1 - [\{4B(B-1)\cdot\beta_2\}/(B+1)^2] \cdot V_D^2 \quad (22)$$

where $V_D$ is the inter-gate voltage of the transistors M17 and M18.

The capacities of respective transistors of the third and fourth differential amplifier circuits 6 and 7 may not be necessarily equal to those of the first differential amplifier circuit 3.

The third and fourth differential output signals 108 and 109 are applied to the differential output terminals pair (8 and 8') to be combined opposite in polarity to each other. As a result, the differential output current $\Delta I_{OUT}$ taken out from the output terminals pair (8 and 8') can be obtained as follows;

$$\Delta I_{OUT} = \Delta I_C - \Delta I_D \quad (23)$$
$$= [4\{B(B-1)\cdot\beta_2\}/(B+1)^2] \cdot (V_D^2 - V_C^2)$$

where, $$V_C = (V_{IN} + E_0) - V_1$$

$$V_D = (V_{IN} + E_0) - V_2$$

As a result, equation (23) can be expressed as follows;

$$\Delta I_{OUT} = [\{4B(B-1)\cdot\beta_2\}/B+1)^2] \cdot (V_1 - V_2) \times \{2 \cdot V_{IN} + 2 \cdot E_0 - (V_1 + V_2)\} \quad (24)$$

As explained above, $$V_1 - V_2 = (R_0 + R_1) \cdot [\Delta I_{REC}]$$

$$V_1 + V_2 = 4 \cdot (R_0 + R_1) \cdot I_0$$

$$E_0 = 2 \cdot (R_0 + R_1) \cdot I_0$$

Therefore, equation (24) can be changed as follows;

$$\Delta I_{OUT} = [\{8 \cdot B(B-1)\cdot\beta_2\}/(B+1)^2] \cdot (R_0 + R_1) \cdot [\Delta I_{REC}] \cdot V_{IN} \quad (25)$$

By substituting equation (17) into equation (25), the following equation can be obtained as;

$$\Delta I_{OUT} = \{256 \cdot A(A-1) \cdot B(B-1) \cdot \Delta_1 \cdot \Delta_2 / \{(A+1)^2 \cdot (B+1)^2\} \times R_0 \cdot (R_0 + R_1) \cdot I_0 \cdot [|V_{IN}|] \cdot V_{IN} \quad (26)$$

Consequently, such a signal current that is proportional to the product $[|V_{IN}|] \cdot V_{IN}$ of the AC signal voltage $V_{IN}$ and the averaged rectified signal voltage $[|_{IN}|]$ can be taken out from the differential output terminals pair (8 and 8').

Thus, an expanding circuit or compressing circuit can be easily formed of the above-described operational circuit.

If it is to be structured as an expanding circuit, the load resistor $R_L$ is connected between the differential output terminals pair 8 and 8'. In this case, the voltage $V_{OUT}$ between the terminals 8 and 8' can be expressed as follows;

$$\begin{aligned} V_{OUT} &= R_L \cdot \Delta I_{OUT} \quad (27)\\ &= \{256 \cdot A(A-1) \cdot B(B-1) \cdot \beta_1 \cdot \beta_2\}/\\ &\quad \{(A+1)^2(B+1)^2\} \times\\ &\quad R_L \cdot R_0 \cdot (R_0 + R_1) \cdot I_0 \cdot [|V_{IN}|] \cdot V_{IN} \end{aligned}$$

As a result, such an AC signal voltage that is proportional to the product $[|V_{IN}|] \cdot V_{IN}$ of the AC voltage $V_{IN}$ and the averaged rectified signal voltage thereof $[|V_{IN}|]$ can be taken out from the differential output terminals pair (8 and 8'), which means that it becomes an expanding circuit.

If a compressing circuit is to be formed of the operational circuit structured as above, an operational amplifier is used in combination therewith. Then, the output signal $V_{OUT}$ of the operational amplifier is inputted into this operational circuit, and the AC signal $V_{IN}$ and the output signal of this operational circuit are inputted into the operational amplifier to be subjected to the differential amplification. Therefore, as already explained above in SUMMARY OF THE INVENTION, such a signal voltage that has a compressed amplitude of the AC signal $V_{IN}$ can be obtained.

In order to obtain a compressing or expanding circuit, any circuit may be used in combination with the abovedescribed operational circuit.

The operational circuit of this embodiment is structured of CMOS type integrated circuits, but not limited thereto, it can be realized by using bipolar type integrated circuits or bipolar MOS type integrated circuits. In the case of using bipolar transistors instead of MOS ones, the same analysis as that already described above may be applied for the operational principle of the first to eighth differential pairs using the characteristics of a bipolar transistor to be used. In this case, as the capacity value thereof, the emitter area is used.

As explained above, the operational circuit of this invention does not use a clock signal and generates the product signal of the AC signal and the averaged rectified signal, so that a compressed or expanded signal which has no effect of clock noise as well as has a good signal-to-noise ratio can be obtained. In addition, the operational circuit is mainly composed of differential amplifier circuits, so that the circuit can be made simple and the scale thereof made small, thus being realizable a semiconductor integrated circuit small in chip size and reduced in power consumption.

What is claimed is:

1. An operational circuit to be used for a compressing or expanding circuit comprising:

an input terminals pair;

a polarity judging circuit which judges the polarity of an AC signal voltage to be applied to said input terminals pair thereby to generate and output a first DC signal and a second DC signal whose voltage difference is predetermined and different in polarity depending on the judgment of being positive and negative;

a first differential amplifier circuit which differentially amplifies said AC signal and said first DC signal thereby to output a first differential output signal;

a second differential amplifier circuit which is equal in circuit structure to said first differential amplifier circuit and differentially amplifies said AC signal and said second DC signal thereby to output a second differential output signal;

an averaging circuit which obtains a rectified signal of said AC in response to said first and second differential output signals and averages said rectified signal thus obtained to generate an averaged rectified signal thereby to generate and output a first signal and a second signal in accordance with the averaged rectified signal, the difference of said first and second signals being dependent only on said averaged rectified signal and the sum of said first and second signals being independent of said averaged rectified signal;

a third differential amplifier circuit which differentially amplifies said AC signal and said first signal thereby to output a third differential output signal;

a fourth differential amplifier circuit which is equal in circuit structure to said third differential amplifier circuit and differentially amplifies said AC signal and said second signal thereby to output a fourth differential output signal; and a differential output terminals pair which are applied with said third and fourth differential output signals so as to be opposite in polarity to each other thereby to output the product of said AC signal and said averaged rectified signal as its output signal.

2. The operational circuit as claimed in claim 1, wherein said first differential amplifier circuit comprises two pairs of transistors, each pair being composed of two transistors different in capacity value from each other and being driven by the corresponding one of constant currents, and yet each pair having the transistor large in capacity value being connected to the transistor small in capacity value of said corresponding pair thereby to form an input terminals pair, and having the transistors small in capacity value being connected to each other and the transistors large in capacity value of said corresponding pair being connected to each other thereby to form an output terminals pair.

3. The operational circuit as claimed in claim 1, wherein said averaging circuit comprises two current mirror circuits and an averaging capacitor.

4. The compressing and expanding operational circuit as claimed in claim 1, wherein said first and second signals have voltages equal in absolute value to each other.

5. The operational circuit as claimed in claim 1, wherein said third and fourth differential amplifier circuits are equal in circuit structure to said first and second differential amplifier circuits.

* * * * *